Figure 1:
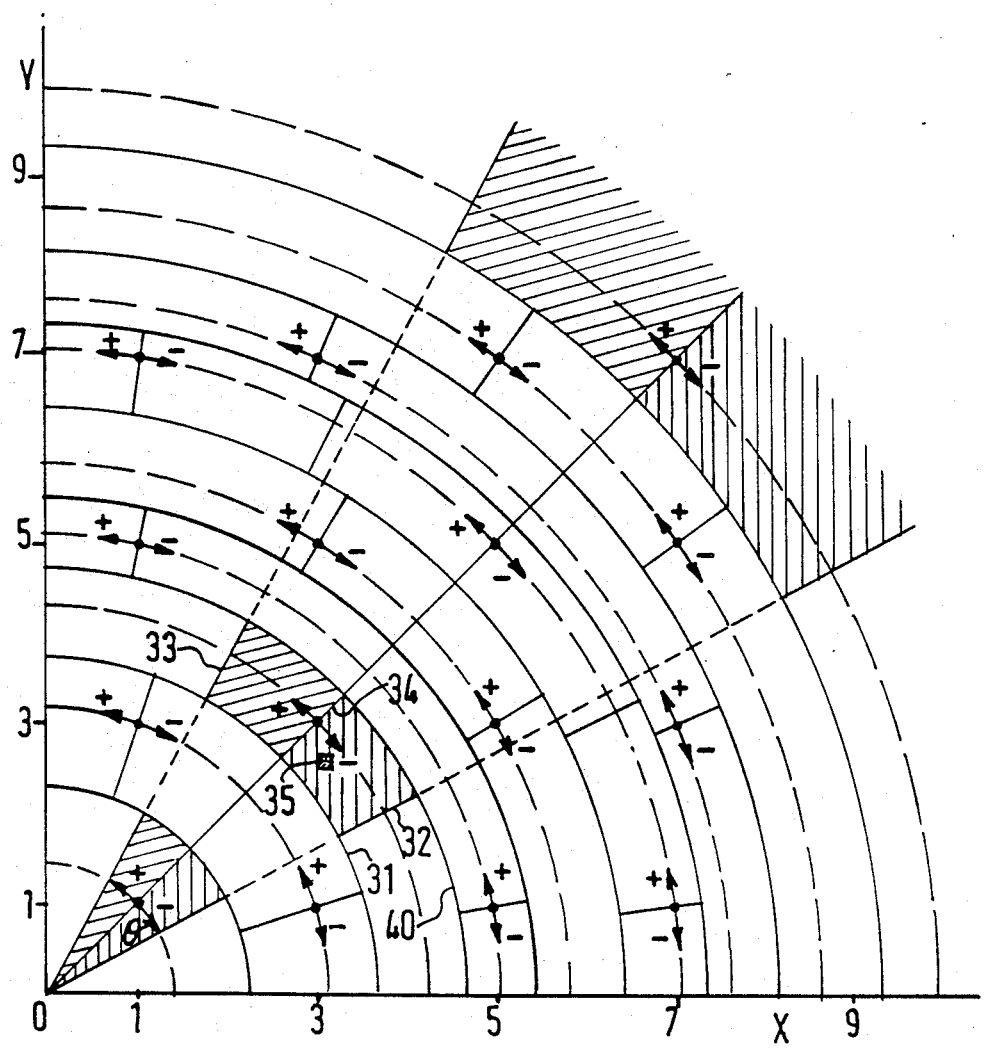

United States Patent [19]

Sari

[11] Patent Number: 4,958,360
[45] Date of Patent: Sep. 18, 1990

[54] CIRCUIT FOR RECOVERING THE CARRIER IN DIGITAL TRANSMISSION SYSTEMS

[75] Inventor: Hikmet Sari, Creteil, France

[73] Assignee: U.S. Philips Corporation, New York, N.Y.

[21] Appl. No.: 420,681

[22] Filed: Oct. 11, 1989

Related U.S. Application Data

[63] Continuation of Ser. No. 249,614, Sep. 26, 1988, abandoned.

[30] Foreign Application Priority Data

Sep. 25, 1987 [FR] France .................. 87 13292

[51] Int. Cl.$^5$ ............................................. H04L 27/06
[52] U.S. Cl. ...................................... 375/97; 375/102; 375/120; 329/307
[58] Field of Search .................. 375/39, 42, 81, 83, 97, 375/120, 102; 329/104, 109, 110, 112, 124

[56] References Cited

U.S. PATENT DOCUMENTS

| | | | |
|---|---|---|---|
| 4,253,189 | 2/1981 | Lemoussu et al. | 375/97 |
| 4,458,356 | 7/1984 | Toy | 375/81 |
| 4,571,550 | 2/1986 | Head | 375/39 |
| 4,648,100 | 3/1987 | Mardirosian | 375/120 |
| 4,687,999 | 8/1987 | Desperben et al. | 329/109 |

FOREIGN PATENT DOCUMENTS 2552959  5/1985  France .

OTHER PUBLICATIONS

A Leclert et al., "Universal Carrier Recovery Loop for QASK and PSK· Signal Sets IEEE Transactions on Communications", vol. Com–31, No. 1, Jan. 1983, pp. 130–136.
I. Horikawa et al., "Design and Performances of a 200 Mbit/s 16 QAM Digital Radio System", IEEE Trans. on Communications, vol. Com.–27 (1979), No. 12, pp. 1953–1958.
Communication from European Patent Office dated Jan. 24, 1989 in EP88202004.3, a Corresponding application.

*Primary Examiner*—Douglas W. Olms
*Assistant Examiner*—Stephen Chin
*Attorney, Agent, or Firm*—Anne E. Barschall

[57] ABSTRACT

A circuit for recovering the carrier of a digitally modulated wave comprising a voltage-controlled oscillator (17) that is controlled by an error signal $\epsilon(\phi)$ in order to adjust the phase of the oscillator, the modulated wave being introduced into two channels, the one in phase (10) and the other in quadrature (20) with the carrier, the two channels being joined together by a phase comparator arrangement (25) which produces the error signal and a sampling clock (H1). The phase comparator arrangement (25) alternately operates as a phase detector and as a frequency detector and therefore comprises an apparatus for selecting received signal points with the aid of selection zones formed by ring segments, situated around certain states of the signal constellation. The signals of the in-phase and quadrature channels are used to address a memory (26) that contains the information belonging to or not belonging to the signal point received in one of the selected zones as well as the amplitude and the error sign that relate thereto. In addition, the phase comparator arrangement (25) comprises apparaturs (28, 29) for generating the sampling clock (H1) which, in the acquisition mode (off-hook), validates the basic clock H only for these selected zones and, in the permanent mode (on-hook), validates all the edges of the clock H for forming the sampling clock.

20 Claims, 5 Drawing Sheets

CIRCUIT FOR RECOVERING THE CARRIER IN DIGITAL TRANSMISSION SYSTEMS

This is a continuation of application Ser. No. 249,614, filed Sept. 26, 1988, now abandoned.

The invention relates to a circuit for recovering the carrier of a digitally modulated wave having a phase symmetry $2\pi/M$, where M is the symmetry order of the constellation of the states, including means for fast automatic acquisition comprising a voltage-controlled oscillator having an output supplying said carrier and a control input to which an error signal $\epsilon(\phi)$ is applied in order to change the oscillator phase and adjust it to the phase of said digitally modulated wave, said wave being introduced:

into a first channel comprising the series arrangement of:
- a demodulator receiving the modulated wave and the oscillator output signal, the demodulator being followed by a low-pass filter which produces a filtered signal X, into a second channel comprising the series arrangement of:
- a phase shifter for shifting the phase of the oscillator signal through 90°
- a demodulator receiving the modulated wave and the phase shifter output signal, the demodulator being followed by a low-pass filter which produces a filtered signal Y, the two channels with a basic clock H (recovered clock symbol) entering a phase comparator arrangement, which determines a comparator signal and validates same with the aid of a variable rate sampling clock which reproduces the basic clock H by discarding certain edges, the comparator signal being stored and then introduced into an amplifying filter which produces the oscillator control error signal $\epsilon(\phi)$, the graphic representation of the states of a signal constellation being defined in polar coordinates by the function $F(A,\Phi)$ where A is the amplitude and $\Phi$ the phase of each signal point of the constellation, and $\phi$ being the phase difference between the received modulated wave and the corresponding signal point constellation.

The invention also relates to the arrangements in which a carrier recovery circuit is used, such as digital transmission arrangements, more specifically, those arrangements in which digital information, after being transmitted by modulation of an electromagnetic wave, is recovered by coherent demodulation. These arrangements are employed in data transmission modems, microwave radio links, space or optical communications systems for heterodyne links.

For effecting the coherent demodulation, the phase of the carrier is generally recovered with the aid of an oscillator included in a carrier recovery loop. The voltage of this oscillator is controlled by a filtered version of the output signal of a phase comparator which detects the phase error between the oscillator and the transmission carrier.

For digital modulation schemes having a large number of states, the phase difference between the oscillator and the carrier must of necessity be limited to small values. The noise bandwidth of the recovery loop is then reduced by means of narrow-band low-pass filtering. This reduction results in very low phase noise, and also in a considerable decrease of the acquisition range. To off-set this disadvantage, auxiliary arrangements are used for assisting in the acquisition.

Among these auxiliary arrangements frequency discriminators are currently used which generate a voltage depending on the frequency difference between the oscillator and the carrier, as described in, for example, French Patent Specification No. 2 552 959, published 25 Oct. 1985. This Specification relates to a carrier recovery circuit for digital modulation schemes having a phase symmetry $2\pi/M$, in which circuit a variable-rate sampling of the output signal of the phase comparator changes the latter into a frequency discriminator. This property is obtained by eliminating zero-crossings of the phase comparator output which occur when the phase error between the oscillator and the carrier is equal to $\pi/M + 2k\pi/M$, where k and M are integers.

In view of multi-state digital amplitude modulations of two quadrature carriers, the frequency discriminator described in the above-mentioned Specification has drawbacks because its gain is degraded, for at the sampled output of the phase comparator zero-crossings occur which are taken into account, but do not correspond to a zero phase error. Actually, starting from a basic clock H, this frequency discriminator generates a sampling clock, in which certain active edges of this basic clock H are eliminated. This elimination occurs when zero-crossings are detected for which the phase difference between the oscillator and the carrier wave is equal to $$\frac{\pi}{M} + \frac{2k\pi}{M}$$

But experience has shown that, in phase and amplitude modulations, there are other zero-crossings at the output of the phase comparator which corrupt a correct acquisition of the carrier. For example, in the case of 16 QAM modulation, the outputs of the currently used phase comparators have zero-crossings when the phase difference is equal to $\phi = \arctan(\frac{1}{3})$ for the states (3,1), (-1,3), (-3, -1), (1,-3). Other states show a similar behaviour. In addition, in the case of a more important number of modulation states, the number of these unwanted zero-crossings will grow, and this causes a deterioration of the performance of the discriminator.

Therefore, the invention has for its object to obviate this degradation by avoiding taking into account all these unwanted zero-crossings.

Thereto, the invention is characterized in that the carrier recovery circuit comprises a phase comparator arrangement which operates alternately as a phase detector and as a frequency detector and therefore comprises means for selecting received signal points with the aid of selection zones located around certain states of the signal constellation, the zones forming ring segments and being determined by the intersection:

first, of the angular sections $(-\theta, +\theta)$ corresponding to a phase difference $\phi$ between the received modulated wave and the corresponding signal point of the constellation, such that the absolute value of $\phi$ is less than $\theta$ where $\theta$ is a preset boundary, each section having a symmetry axis passing through the diagonal states of the signal constellation, these zones being situated around the diagonal states of the signal constellation for which zones in a quarter of the plane there is only a single state having a given amplitude A, secondly, of the boundary circles, centered at the origin of the signal constellation, of radius $$\frac{A1 + A2}{2},$$

the circles being equidistant from two consecutive circles that join the states together, the one passing through the states at the constant amplitude A1 and the other passing through the states at the consecutive constant amplitude A2, thus forming rings, the point of origin forming the innermost circle, the outside boundary (circle) being restricted by the maximum amplitude of the detected signal, the arrangement further including sampling clock generating means which in the acquisition mode (unlocked), validate the basic clock H only for these selected zones and which, in the permanent mode (locked), validate all the edges of the clock H for forming the sampling clock.

When states of the constellation have a minimum angle between two adjacent states in the same circle of less than $\pi/2$, the phase difference such as the absolute value of $\phi < \theta$ is taken into account, this means that the zone is selected when the signs of the phase difference are the same for the two adjacent states.

For selecting the zones, the data X and Y are used to address a memory which contains the information belonging to or not belonging to the signal point received in one of the selected zones as well as the amplitude and the sign of the error which relate thereto.

This circuit is based on storing the error signal when the absolute value of the phase difference $\phi$ exceeds a certain value. This storing is effected in bistable triggers whose output data remain constant between two valid, recognized zero-crossings. This error signal provides information on the sign of the frequency difference between the oscillator and the carrier. This storing is effected when the phase difference at the output of the comparator is situated within the defined selection zones.

This carrier recovery circuit utilizes a phase comparator having the following properties:

its characteristic becomes zero at the occurrence of a zero phase error;

its characteristic has the periodicity of $2\pi/M$, where M is the symmetry order of the modulation.

The invention is used for digital modulation schemes having a phase symmetry $2\pi/M$, where M is the symmetry order of the signal constellation. Thus, a 4-state phase modulation has a symmetry of the order of 4, for an 8-state phase modulation the symmetry is of the order of 8, for a 16 QAM modulation (phase and amplitude modulation by means of amplitude modulation of two quadrature carriers) the symmetry is of the order of 4.

But the invention presents its determining advantages in the case of an amplitude and phase modulation in a great number of states, of the $2^n$ type (n=integer), for example, 64 QAM, 256 QAM. It also presents advantages in the case of amplitude and phase modulations for which the phase differences between certain signal points of the signal constellation are less than the symmetry $2\pi/M$. Thus, in 64 QAM modulation the symmetry is $\pi/2$, but the phase difference between the states (+1, +1) and (+1, +5) is $\pi/4$-arc tan (1/5), thus less than $\pi/2$.

During the carrier acquisition period, the digitally modulated wave will be able to present all the signal points of the signal constellation. Consequently, the invention cancels all the received signal points liable to cause a faulty acquisition and uses only the points that are liable to cause a correct acquisition.

Thus, the carrier recovery circuit according to the invention includes means for selecting the received signal points with the aid of zones situated around certain states of the signal constellation.

This selection is effected by determining whether the received signal points belong or do not belong to zones for which any received signal point in these zones presents a phase difference with the transmitted signal point, such that the absolute value of this phase difference remains below, except for $2k\pi/M$, a predetermined value, which renders it possible to eliminate the zero-crossings at $k\pi/M$.

Thus, the phase information taken into account is only the information supplied by the received signal points in these zones. To determine whether these points belong to these zones, and thereafter taking account of the information assignable thereto, the invention provides a phase comparator arrangement that can be inserted in a carrier recovery circuit. For that purpose, the digitally modulated wave is simultaneously fed into two demodulators, which also receive the output signal of the oscillator, one directly and the other through a $\pi/2$ phase shifter, and produce the demodulated signals $X_1$ and $Y_1$, respectively. These demodulated signals are filtered and provide the respective signals X (in-phase) and Y (quadrature). The signals X and Y are fed into the phase comparator arrangement and are used to address a memory. The data X and Y are encoded in a certain number of bits depending on the precision with which the selection zones are to be determined.

The phase comparator arrangement comprises two analog-to-digital converters inserted in the in-phase channel and quadrature channel, respectively, so as to receive the cartesian coordinates X and Y of the received signal point, the two converters supplying data that address a memory whose output supplies p bits, one of the bits being a bit belonging to the received signal point in one of the selection zones which activates an input of a logic OR gate whose other input receives an external locked/unlocked signal, the output signal of the OR gate entering an AND gate with the basic clock H so as to suppress the edges when, in the acquisition mode, the received signal point is not present in a selection zone, and to validate all the edges in the permanent state, in order to form the sampling clock which activates p−1 bistable triggers that receive the p−1 bits from the memory, the output signals of the bistable triggers driving a digital-to-analog converter which delivers the error signal that acts on the oscillator through the amplifying filter.

In one embodiment, the memory produces p=2 bits, one for validating the comparator signal and the other for providing the constant amplitude difference sign.

Figure 2:
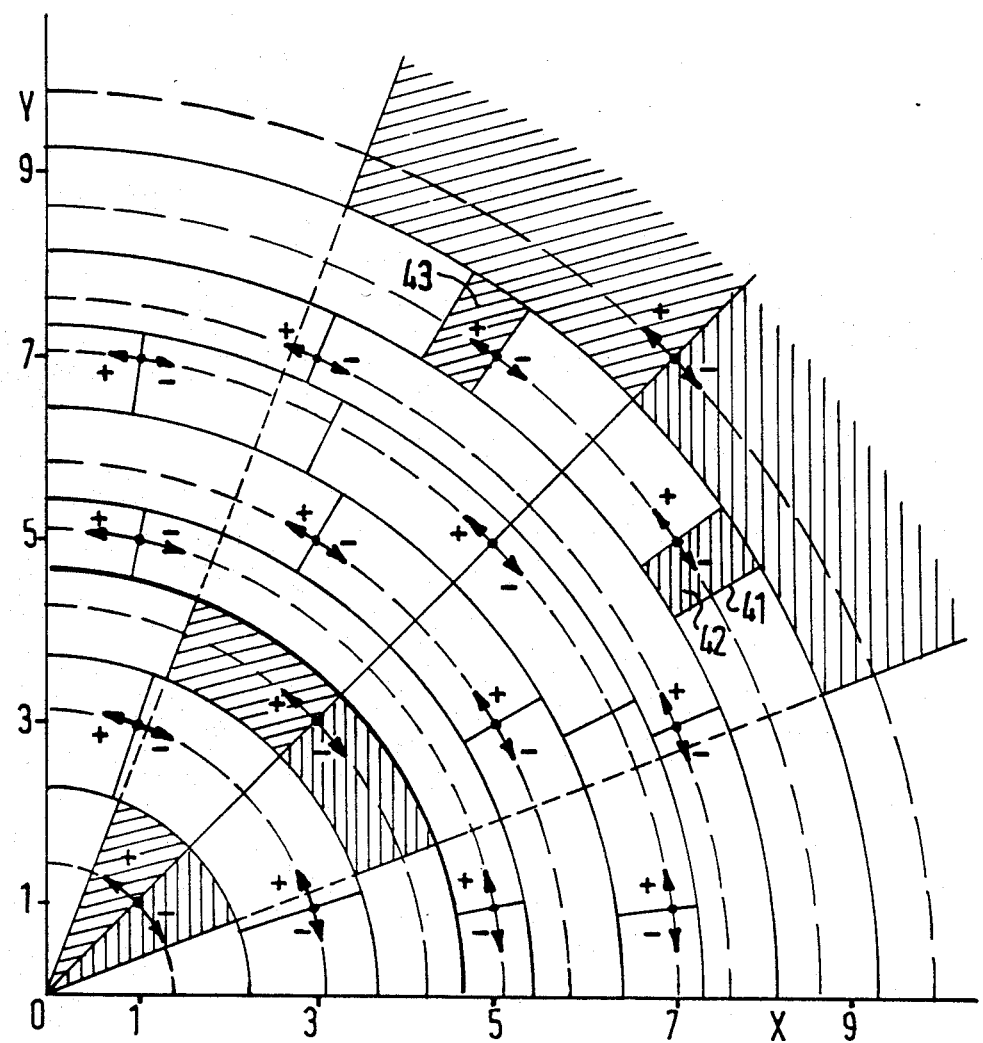
Figure 3:
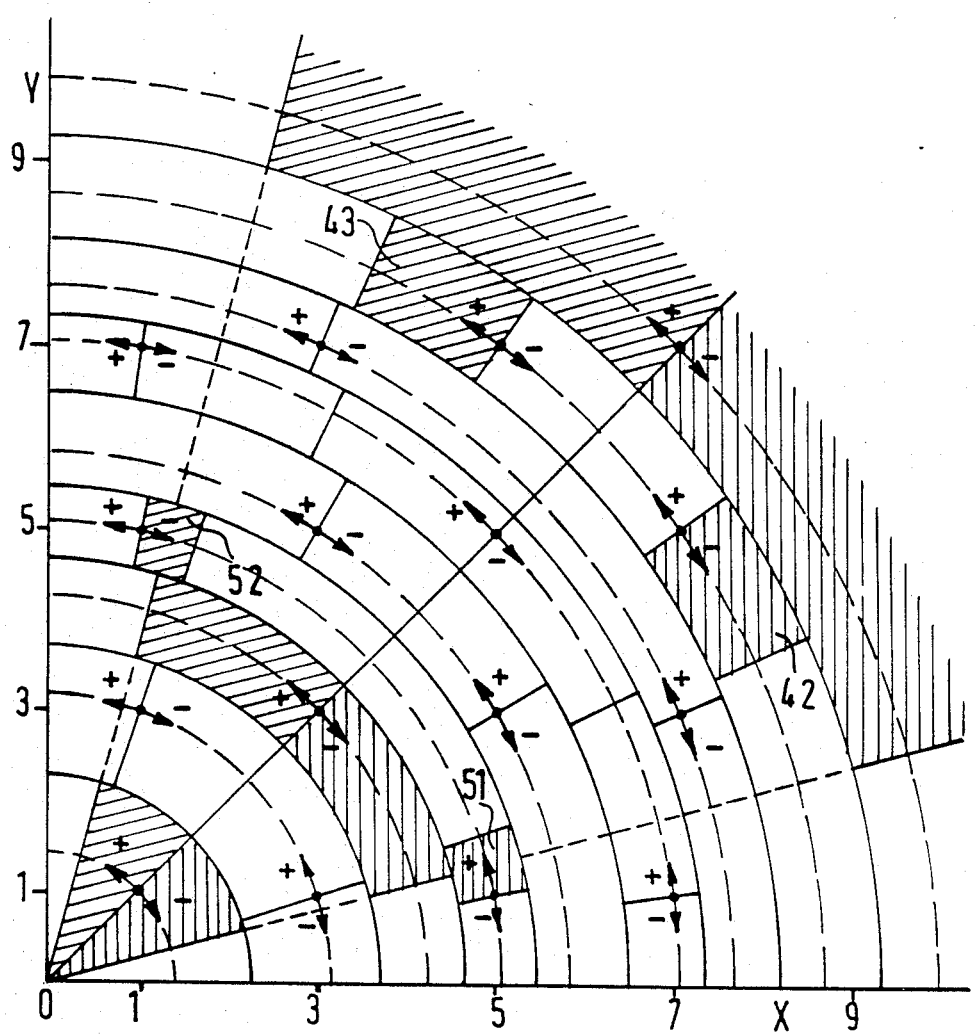
Figure 4:
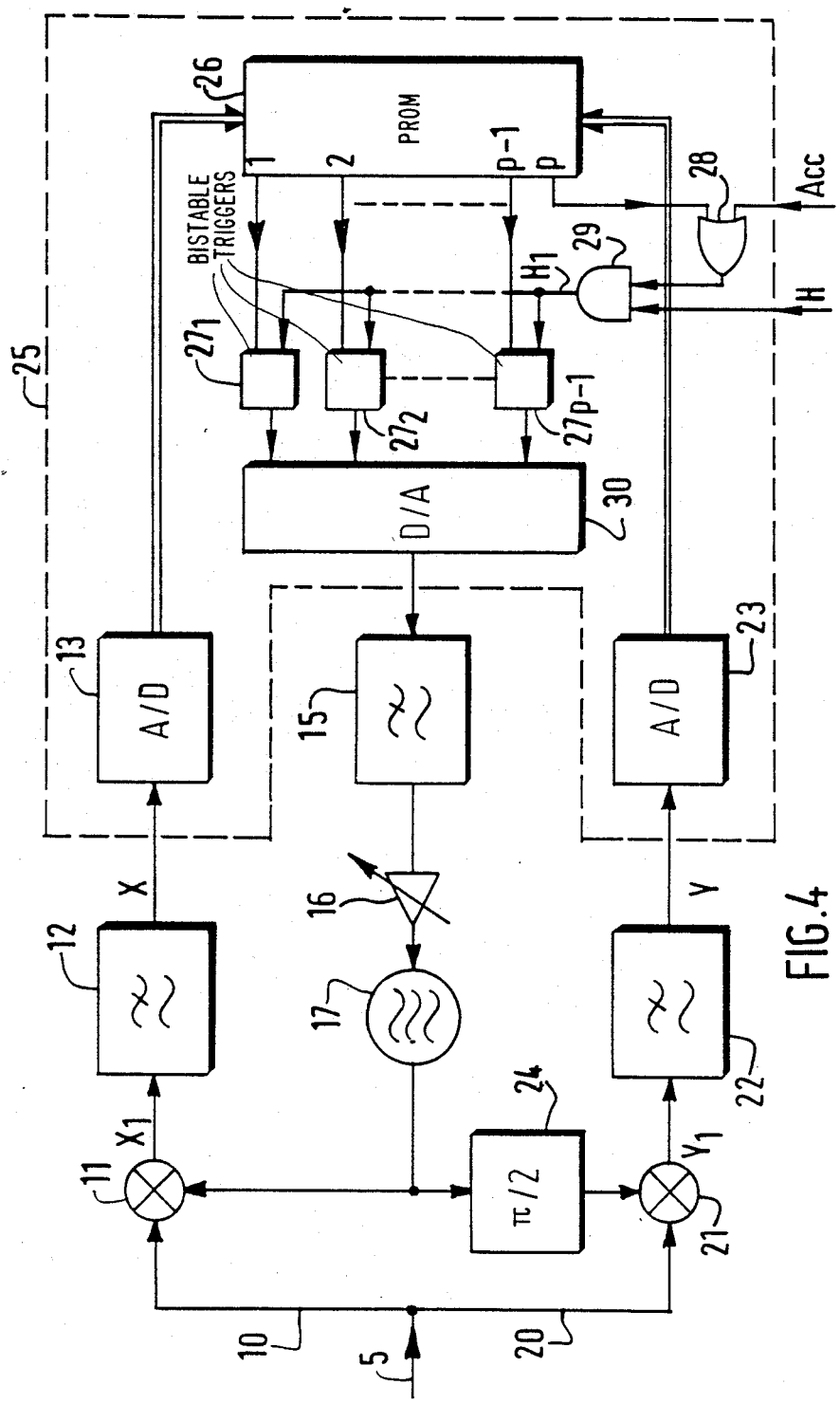
Figure 5:
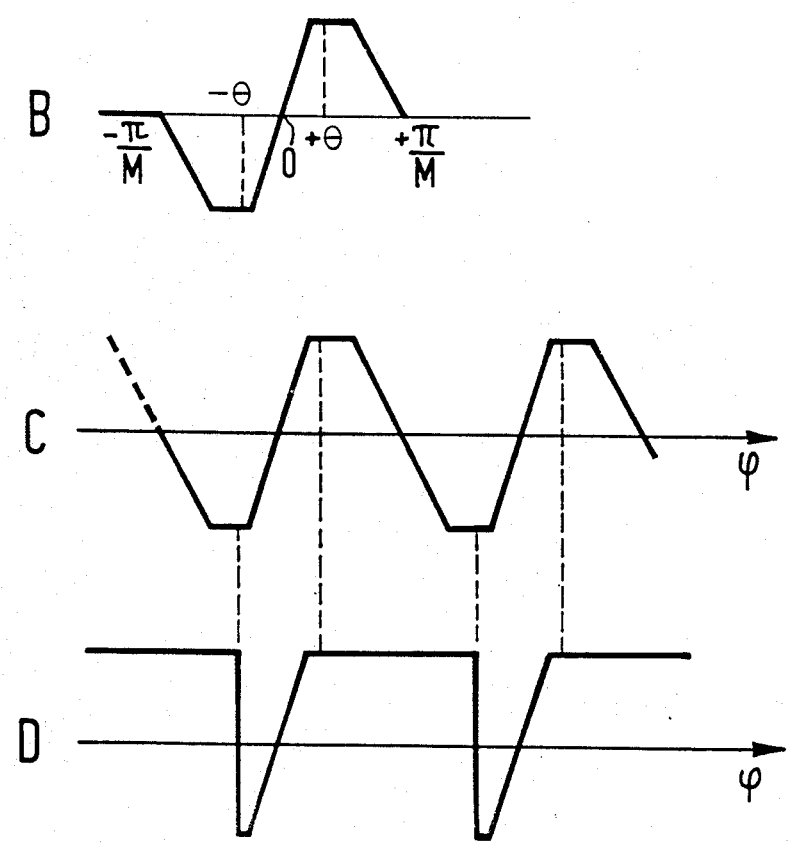

In another embodiment, the memory produces p=3 bits, one for validating the comparator signal and the other two for providing the amplitude and the phase difference sign The invention and how it can be put into effect will be better understood from the following description given by way of non-limitative example with reference to the accompanying drawings, in which:

FIG. 1: shows, in a quarter plane, the 64 QAM signal constellation in which the selection zones according to the invention are represented in the case of a predetermined boundary $\theta \leq 18.92°$, FIG. 2: shows a signal constellation analogous to that of FIG. 1 for $18.92° < \theta \leq 22.62°$, FIG. 3: shows a signal constellation analogous to that of FIG. 1 for $22.62° < \theta \leq 28.07°$, FIG. 4: shows a block diagram of the carrier recovery circuit according to the invention, FIG. 5: shows the phase comparator characteristic and variations in the phase of the comparator output signal before and after storage in a bistable trigger.

FIG. 1 shows in a quarter plane the 16 states of a 64 QAM wave. For the overall plane this system has a phase symmetry $2\pi/M = \pi/2$. In accordance with the phase variation of the incoming modulated wave relative to the oscillator, for a specific state of the signal constellation, the received signal point will shift through a circle centered at 0 passing through the specific state or the vicinity of this specific state.

Between two states of moduli A1 and A2, the moduli A1 and A2 being consecutive, for example the states (3,3) and (5,1), a boundary circle 40 is defined equidistant from the two states such that its radius is $$\frac{A1 + A2}{2}.$$

This permits defining the zones belonging to the two states as a function of their respective moduli, and to define rings passing through all the states having the same modulus. Inside these rings a signal point of whatever phase may be received and situated on either one side of the state of the signal constellation, which defines a phase difference. The positive sign is effected if the phase of the received signal point is higher than that of the constellation point and vice versa. Subsequently, a subdivision is effected into polar coordinates of the overall plane of the constellation. A rotation in either direction characterizes the sign of the phase difference.

The invention defines a boundary $\theta$ for the phase difference $\phi$ beyond which the received signal point is no longer used for synchronizing the local carrier of the recovery circuit with the transmitted carrier. The zones that are determined by the invention are thus bounded by the bounding circles and by the section $(-\theta, +\theta)$. Thus, around the state (3,3) there is a selection zone, provided with a negative sign, bounded by the bounding circles 40 and 31 and the segments 32 and 34. There is also a selection zone with a positive sign bounded by the same bounding circles and by the segments 33 and 34.

This occurs in the same fashion for the states (1,1) and (7,7) with the following characteristic features. For the state (1,1) the internal bounding circle is constituted by the origin. For the state (7.7) the external bounding circle is not defined, the boundary being constituted by the maximum amplitude of the received signal point.

The states $(\pm 1, \pm 1)$, $(\pm 3, \pm 3)$, $(\pm 7, \pm 7)$ have an equal symmetry at $\pi/2$ for the overall 64 QAM signal constellation. Thus, they are certainly determined in a quarter plane of the signal constellation. On the other hand, there is in a quarter plane a diagonal state $(+5, +5)$ which has a symmetry lower than $\pi/2$ and thus cannot be distinguished from the states $(+7, +1)$ and $(+1, +7)$. Thus, in the ring passing through these three states there are not any selection zones.

The invention thus determines three selection zones situated in the rings defined around diagonal states (1,1), (3,3), (7,7). They are shown in FIG. 1 by hatched areas.

The incoming signal shown in cartesian data along X and Y, allows to determine whether the received signal point belongs or does not belong to one of these zones. The data along X and Y are encoded over several bits in accordance with the desired precision. If the received signal point is situated in a section of the selection zone, such as 35, it will be provided with sign information (here the negative sign) and amplitude information characterizing, if need be, its distance relative to the state (3,3), in order to produce the adequate phase correction. A simple encoding can be constituted by two bits, one for the sign and the other for the amplitude of the correction, thus constant for the whole zone.

A more elaborate encoding can be formed by three bits, one for the sign and the other two bits for defining several correction amplitudes according to the position of signal point 35 within the selection zone.

This encoding is effected for all the selection zones. The boundaries $\theta$ can otherwise be different for each of the zones.

FIG. 2 shows the same situation as that of FIG. 1 but with a larger boundary value $\theta$. In this case, starting from the state $(+5, +7)$ for example, a section is shown corresponding with the phase difference $\phi = -\theta$ defining the segment 41 which constitutes the range of the zone with the negative sign belonging to state (5, 7). This zone is superposed on the zone with the negative sign belonging to the state (7, 5). When the two phase difference zones having a negative sign cover each other, and every received signal point is situated in the hatched area 42, the sign of the correction is determined unambiguously. Because of the symmetry, zone 43 belongs to the state (5, 7) with a positive correction. The two selection zones 42 and 43 can thus be used for determining the sign of the phase difference $\phi$ when the value $\theta$ exceeds $2[45°\text{-arc tan }(5/7)] = 18.92°$, that is to say when the negative zone belonging to the state (5, 7) covers the negative zone belonging to the state (7, 5).

FIG. 3 shows the same situation as that of FIG. 2 but with an even larger boundary value $\theta$. Actually, when $\theta$ reaches 2 arc tan $(1/5) = 22.62°$, new selection zones 51, 52 belonging to the states (5, 1) and (1, 5) will appear in the same way as in the preceding case.

Thus, for the quarter plane, when $\theta \leq 18.92°$, the selection zones that are suitable for use are shown in FIG. 1. When $18.92° < \theta \leq 22.62°$, the selection zones that are suitable for use are shown in FIG. 2. When $22.62° < \theta \leq 28.07° = 2[45°\text{-arc tan }(3/5)]$ the selection zones that are suitable for use are shown in FIG. 3.

FIG. 4 shows the block diagram of the carrier recovery circuit. The digitally modulated wave arrives at the input terminal 5 and bifurcates into two channels 10 and 20 which are in phase and in quadrature, respectively, with the wave from the oscillator 17. This oscillator applies its signal directly to the demodulator 11 of the inphase channel and also to the demodulator 21 in the quadrature channel via the $\pi/2$ phase shifter 24. The output signals from the demodulators 11 and 21 are filtered in the respective low-pass filters 12 and 22, whose output signals are the respective signals X and Y. These signals penetrate into the phase comparator arrangement 25, or two analog-to-digital converters 13, 23, respectively, which supply data addressing a PROM memory 26. This memory delivers p bits of which p−1 bits are stored in the bistable triggers $27_1, 27_2 \ldots 27_{p-1}$. These p−1 bits form a code of the sign and the amplitude of the estimated phase error. The $p^{th}$ bit $p_p$ determines whether the received signal point determined by the coordinates X, Y belongs to or does not belong to a chosen selection zone. The $p^{th}$ bit enters an OR gate 28 which receives a signal ACC determining whether the carrier recovery circuit is in the permanent mode (locked) (ACC=1) or in the acquisition mode (unlocked) (ACC=0). In fact, the recovery circuit according to the invention operates as a permanent mode (ACC=1) phase detector. In the acquisition mode (ACC=0) it operates as a frequency detector. Therefore, the output signal of the logic OR gate 28 enters logic AND gate 29 with the basic clock H. Then the signal $H_1$ at the output of the logic AND gate 29 is the copy of the clock H when ACC=1. On the other hand, when ACC=0 the edges are validated if $p_p=1$ and suppressed if $p_p=0$.

This signal $H_1$ constitutes the clock for the bistable triggers $27_1$ to $27_{p-1}$. Thus, the p−1 bits that are produced by the memory 26 at each clock pulse H are stored in the bistable triggers. The latter keep their information for the duration when ACC=0 and $p_p=0$.

All the output signals of the p−1 bistable triggers enter a digital-to-analog converter 30 which supplies a signal that passes through a low-pass filter 15 then through an amplifier 16 in order to produce a control signal $\epsilon(\phi)$ that controls the oscillator 17. Evidently, it will be possible to those skilled in the art to reverse the logic state of the signals and, consequently, change the type of logic gate used.

The characteristic feature of the phase comparator arrangement 25 according to the invention is to be able to operate as a frequency detector when ACC=0 and as a phase detector when ACC=1.

FIG. 5 shows in B the characteristic features of a phase comparator for a phase comprised between $-\pi/M$ and $+\pi/M$. On either side of signal point 0 (phase difference zero), the phase comparator supplies a voltage as a function of the phase difference which allows to bring the oscillator frequency under control. The output voltage of the comparator is represented in C. The mean value of this output voltage is zero. For correcting the oscillator frequency, the value of the phase difference is stored with the aid of a phase comparator arrangement that characterizes the invention. When the absolute value of the phase difference exceeds the boundary $\theta$, which corresponds with the enabling of the chosen selection zone, the triggers latch the condition of the output signal of the memory. Such a latched signal is shown in D; its mean value is no longer zero. It permits to correct the oscillator frequency. The curves C and D of FIG. 5 are representative of a positive frequency difference, that is to say, a greater modulated carrier frequency than the oscillator frequency. For a negative frequency difference the curves C and D show an inverse trend.

What is claimed is:

1. A circuit for recovering a carrier from a digitally modulated wave having a phase symmetry $2\pi/M$, where M is an integer representing a symmetry order of a modulation scheme of said digitally modulated signal, said modulation scheme corresponding to a signal constellation having states, which states are representable using a graphic representation in polar coordinates by a function $F(A,\Phi)$, where A and $\Phi$ represent modulus and phase, respectively, of the states in the signal constellation, the circuit comprising:

(a) a voltage-controlled oscillator having an output for supplying an output signal which represents said carrier and a control input for receiving an error signal $\epsilon(\phi)$ for changing a phase of the oscillator to adjust it to a phase of said digitally modulated wave, the phase $\phi$ being the phase difference between signal points of received digitally modulated wave and corresponding states, idealized ones of said signal points being states of said signal constellation;

(b) a first channel for in-phase demodulation;

(c) a second channel for quadrature-phase demodulation;

(d) phase comparing means, coupled to outputs of the first and second channels and to receive a basic recovered clock signal H, for determining and validating a comparator signal, the phase comparing means alternatively operating as phase detector and as a frequency detector and comprising means for selecting received signal points using selection zones, said selection zones being defined with respect to said graphic representation as located around certain states of the signal constellation, said selection zones appearing in said graphic representation as ring segments;

(e) means for producing a variable rate sampling clock signal which reproduces the basic clock signal H by discarding certain edges, said producing means:

(i) when the circuit is in acquisition mode (unlocked), validating the basic clock signal H only for the selection zone; and (ii) when the circuit is in permanent mode (locked), validating all edges of the clock signal H for forming the sampling clock signal;

said sampling clock signal being supplied to the comparing means to control validating of the comparator signal; and (f) means for converting the comparator signal to the error signal $\epsilon(\phi)$.

2. The circuit of claim 1 wherein each ring segment comprises an intersection of two respective regions:

(a) first, a respective angular section $(-\theta,\theta)$ corresponding to a phase difference $\phi$ between a signal point of the received digitally modulated wave and a corresponding state of the signal constellation, such that the absolute value of $\phi$ is less than $\theta$, where $\theta$ is a preset boundary value, each respective angular section having a symmetry axis passing through a respective diagonal state of the signal constellation, which respective diagonal state has a modulus which is unique amongst the states in a same $2\pi/M$ section of the plane; and (b) secondly, boundary circles, centered at the origin of the signal constellation, of radius $$\frac{A1 + A2}{2},$$

the circles being equidistant from respective first and second consecutive circles, the respective first consecutive circle passing through a first respective plurality of states which each have a modulus value A1, the respective second consecutive circle passing through a second respective plurality of states which each have a modulus value A2, the respective first and second consecutive circles together forming a ring, the point of origin forming an innermost circle, a maximum amplitude of the received digitally modulated wave determining an outermost circle.

3. The circuit of claim 2 wherein:
(a) the digitally modulated wave is of the 64 QAM type;
(b) the preset boundary value satisfies the inequality $\theta \leq 18.92°$; and
(c) the selection zones comprise a respective ring segment for each of the 12 states defined by the following list of Cartesian coordinates $(\pm 1, \pm 1)$, $(\pm 3, \pm 3)$, $(\pm 7, \pm 7)$.

4. The circuit of claim 1 wherein the first channel comprises a series arrangement of:
(i) a demodulator receiving said modulated wave and the output signal of the oscillator; and
(ii) a low-pass filter, coupled to an output of the demodulator, for producing a filtered signal X.

5. The circuit of claim 1 wherein the second channel comprises a series arrangement of:
(i) a phase shifter for shifting a phase of the output signal of the oscillator through 90°;
(ii) a demodulator receiving the digitally modulated wave and an output signal of the phase shifter; and
(iii) a low-pass filter, coupled to an output of the demodulator, for producing a filtered signal Y.

6. The circuit of claim 1 wherein the converting means comprises:
(a) means for storing the comparator signal; and
(b) an amplifying filter, coupled to receive the comparator signal from the storing means, for producing the error signal $\epsilon(\phi)$.

7. The circuit of claim 2 wherein
(a) the selection zones further comprise second ring segments for respective adjacent non-diagonal states of the signal constellation having a same modulus within a same $2\pi/M$ section of the plane, said second ring segments being defined by the intersections of two respective regions:
(i) first, subsections of respective angular sections $(\theta, -\theta)$, which respective angular sections correspond to a phase difference $\phi$ between a signal point of the digitally modulated wave and a corresponding state of the signal constellation, such that $|\phi| < \theta$, where $\theta$ is said preset boundary value, each respective angular section having a symmetry axis passing through a respective non-diagonal state of the signal constellation, which subsections contain signal points which for which the signs of the following two phase differences are the same:
(A) the phase difference $\phi$ with respect to a corresponding state; and
(B) a second phase difference $\phi$ with respect to a state adjacent to the corresponding state are the same; and
(ii) secondly, boundary circles, centered at the origin of the signal constellation, of radius $$\frac{A1 + A2}{2},$$

the circles being equidistant from respective first and second consecutive circles, the respective first consecutive circle passing through a first respective plurality of states which each have a modulus value A1, the respective second consecutive circle passing through a second respective plurality of states which each have a modulus value A2, the respective first and second consecutive circles together forming a ring.

8. The circuit of claim 7 wherein
(a) the digitally modulated wave is of the 64 QAM type;
(b) the preset boundary value $\theta$ satisfies the inequality $18.92° < \theta \leq 22.62°$;
(c) the ring segments comprise a respective first ring segment for each of the 12 states defined by the following list of Cartesian coordinates $(\pm 1, \pm 1)$, $(\pm 3, \pm 3)$, and $(\pm 7, \pm 7)$; and
(d) said second ring segments comprise a respective second ring segments for each of the 8 states defined by the following list of Cartesian coordinates $(\pm 5, \pm 7)$, $(\pm 7, \pm 5)$.

9. The circuit of claim 7 wherein
(a) the digitally modulated wave is of the 64 QAM type;
(b) the preset boundary value $\theta$ satisfies the inequality $22.62° < \theta \leq 28.07°$;
(c) the ring segments comprise a respective first ring segment for each of the 12 states defined by the following list of Certesian coordinates $(\pm 1, \pm 1)$, $(\pm 3, \pm 3)$, and $(\pm 7, \pm 7)$; and
(d) said second ring segments comprise a respective second ring segment for each of the 8 states defined by the following list of Cartesian coordinates $(\pm 5, \pm 1)$, $(\pm 1, \pm 5)$ 10. The circuit of claim 1 wherein
(a) the first channel comprises a series arrangement of:
(i) a first demodulator receiving said modulated wave and the output signal of the oscillator; and
(ii) a low-pass filter, coupled to an output of the first demodulator, for producing a filtered signal X;
(b) the second channel comprises a series arrangement of:
(i) a phase shifter for shifting a phase of the output signal of the oscillator through 90°;
(ii) a second demodulator receiving the digitally modulated wave and an output signal of the phase shifter; and
(iii) a low-pass filter, coupled to an output of the second demodulator, for producing a filtered signal Y; and
(c) the phase comparing means further comprises a memory, addressable by the signals X and Y to supply data relating to a received signal point that falls within one of the selection zones as well as an amplitude and sign of the error signal.

11. The circuit of claim 10 wherein
(a) the memory has an output for supplying p bits, one of the p bits relating to whether the received signal point is in one of the selection zones;
(b) the phase comparing means further comprises
(i) first and second analog-to-digital converters coupled in the first and second channels, respectively, for receiving Cartesian coordinates X and Y of the received signal point, the first and second converters producing data that addresses the memory;
(ii) a logic OR gate have a first input activated by the one bit and a second input for receiving an external locked/unlocked signal;
(iii) a logic AND gate having a first input coupled to receive an output signal of the OR gate, a second input coupled to receive the basic clock signal H, and an output, and AND gate being for
  (A) suppressing the edges in the basic clock signal H when the unlocked signal is received and the received signal point is in one of the selection zones; and
  (B) validating the edges in the basic clock signal H when the locked signal is received,
so that the sampling clock signal appears at an output of the AND Gate;
  (iv) p−1 triggers, activated by the sampling clock signal, for receiving p−1 bits form the memory; and
  (v) a digital-to-analog converter coupled to outputs of the p−1 triggers; and
(c) the apparatus further comprises an amplifying filter coupled between the digital-to-analog converter and the control input of the oscillator.

12. The circuit of claim 11 wherein p=2, a first bit being for validating the comparator signal and a second bit for providing a constant amplitude phase difference sign.

13. The circuit of claim 11 wherein p=3, a first bit being for validating the comparator signal and second and third bits being for providing an amplitude and a phase difference sign.

14. The apparatus of claim 10 wherein the memory is a PROM.

15. Apparatus for use in a circuit for recovering a carrier from a digitally modulated wave having a phase symmetry $2\pi/M$, where M is an integer representing a symmetry order of a modulation scheme of said digitally modulated signal, said modulation scheme corresponding to a signal constellation having states, which states are representable using a graphic representation in polar coordinates by a function $F(A,\Phi)$, where A and $\Phi$ represent modulus and phase, respectively, of the states in the signal constellation, the apparatus comprising:
(a) phase comparing means, coupled to outputs of a first, in-phase demodulation channel and of a second, quadrature-phase demodulation channel and coupled to receive a basic recovered clock signal H, for determining and validating a comparator signal, the phase comparing means alternatively operating as phase detector and as a frequency detector and comprising means for selecting received signal points using selection zones, said selection zones being defined with respect to said graphic representation as located around certain states of the signal constellation, said selection zones appearing in said graphic representation as ring segments, the comparator signal being for supplying to control a voltage-controlled oscillator which in turn controls demodulation in the first and second channels, and
(b) means for producing a variable rate sampling clock signal which reproduces the basic clock signal H by discarding certain edges, said producing means:
  (i) when the circuit is in acquisition mode (unlocked), validating the basic clock signal H only for the selection zones; and
  (ii) when the circuit is in permanent mode (locked), validating all edges of the clock signal H for forming the sampling clock signal;

said sampling clock signal being supplied to the comparing means to control validating of the comparator signal.

16. The apparatus of claim 15 wherein each ring segment comprises an intersection of two respective regions:
(i) first, a respective angular section $(-\theta,\theta)$ corresponding to a phase difference $\phi$ between a signal point of the received digitally modulated wave and a corresponding state of the signal constellation, such that the absolute value of $\phi$ is less than $\theta$, where $\theta$ is a preset boundary value, each respective angular section having a symmetry axis passing through a respective diagonal state of the signal constellation, which respective diagonal state has a modulus which is unique amongst the states in a same $2\pi/M$ section of the plane; and
(ii) secondly, boundary circles, centered at the origin of the signal constellation, of radius $$\frac{A1 + A2}{2},$$

the circles being equidistant from respective first and second consecutive circles, the respective first consecutive circle passing through a first respective plurality of states which each have a modulus value A1, the respective second consecutive circle passing through a second respective plurality of states which each have a modulus value A2, the respective first and second consecutive circles together forming a ring, the point of origin forming an innermost circle, a maximum amplitude of the received digitally modulated wave determining an outermost circle.

17. The apparatus of claim 16 wherein:
(a) the digitally modulated wave is of the 64 QAM type;
(b) the preset boundary value satisfies the inequality $\theta \leq 18.92°$; and
(c) the selection zones comprise a respective ring segment for each of the 12 states defined by the following list of Cartesin coordinates $(\pm 1, \pm 1)$, $(\pm 3, \pm 3)$, $(\pm 7, \pm 7)$.

18. The circuit of claim 15 wherein p1 (a) the selection zones further comprise second ring segments for respective adjacent non-diagonal states of the signal constellation having a same modulus within a same $2\pi/M$ section of the plane, said second ring segments being defined by the intersections of two respective regions:
(i) first, subsections of respective angular sections $(\theta, -\theta)$, which respective angular sections correspond to a phase difference $\phi$ between a signal point of the digitally modulated wave and a corresponding state of the signal constellation, such that $|\phi| < \theta$, where $\theta$ is said preset boundary value, each respective angular section having a symmetry axis passing through a respective non-diagonal state of the signal constellation, which subsections contain signal points which for which the signs of the following two phase differences are the same:
  (A) the phase difference $\phi$ with respect to a corresponding state; and
  (B) a second phase difference $\phi$ with respect to a state adjacent to the corresponding state are the same; and (ii) secondly, boundary circles, centered at the origin of the signal constellation, of radius $$\frac{A1 + A2}{2},$$

the circles being equidistant from respective first and second consecutive circles, the respective first consecutive circle passing through a first respective plurality of states which each have a modulus value A1, the respective second consecutive circle passing through a second respective plurality of states which each have a modulus value A2, the respective first and second consecutive circles together forming a ring.

19. The circuit of claim 18 wherein
(a) the digitally modulated wave is of the 64 QAM type;
(b) the preset boundary value $\theta$ satisfies the inequality $18.92° < \theta \leq 22.62°$;
(c) the ring segments comprise a respective first ring segment for each of the 12 states defined by the following list of Cartesian coordinates $(\pm 1, \pm 1)$, $(\pm 3, \pm 3)$, and $(\pm 7, \pm 7)$; and
(d) said second ring segments comprise a respective second ring segment for each of the 8 states defined by the following list of Cartesian coordinates $(\pm 5, \pm 7)$, $(\pm 7, \pm 5)$.

20. The circuit of claim 18 wherein
(a) the digitally modulated wave is of the 64 QAM type;
(b) the preset boundary value $\theta$ satisfies the inequality $22.62° < \theta \leq 28.07°$;
(c) the ring segments comprise a respective first ring segment for each of the 12 states defined by the following list of Cartesian coordinates $(\pm 1, \pm 1)$, $(\pm 3, \pm 3)$, and $(\pm 7, \pm 7)$; and
(d) said second ring segments comprise a respective second ring segment for each of the 8 states defined by the following list of Cartesian coordinates $(\pm 5, \pm 1)$, $(\pm 1, \pm 5)$.

* * * * *